United States Patent
Arthur et al.

(10) Patent No.: US 10,957,759 B2
(45) Date of Patent: Mar. 23, 2021

(54) SYSTEMS AND METHODS FOR TERMINATION IN SILICON CARBIDE CHARGE BALANCE POWER DEVICES

(71) Applicant: General Electric Company, Schenectady, NY (US)

(72) Inventors: Stephen Daley Arthur, Niskayuna, NY (US); Reza Ghandi, Niskayuna, NY (US); Alexander Viktorovich Bolotnikov, Niskayuna, NY (US); David Alan Lilienfeld, Niskayuna, NY (US); Peter Almern Losee, Clifton Park, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 16/235,486

(22) Filed: Dec. 28, 2018

(65) Prior Publication Data
US 2020/0203487 A1 Jun. 25, 2020

Related U.S. Application Data
(60) Provisional application No. 62/783,683, filed on Dec. 21, 2018.

(51) Int. Cl.
*H01L 29/06* (2006.01)
*H01L 29/16* (2006.01)
(Continued)

(52) U.S. Cl.
CPC ...... *H01L 29/0634* (2013.01); *H01L 21/0465* (2013.01); *H01L 29/0619* (2013.01);
(Continued)

(58) Field of Classification Search
CPC ............ H01L 29/0634; H01L 29/7811; H01L 29/1608; H01L 29/0615; H01L 29/0619
(Continued)

(56) References Cited

U.S. PATENT DOCUMENTS 6,005,261 A 12/1999 Konstantinov
9,461,108 B2 10/2016 Konstantinov
(Continued)

FOREIGN PATENT DOCUMENTS

WO 2017105414 A1 6/2017

OTHER PUBLICATIONS

Koo, Yoon-Mo, et al.; "The Analysis of the Breakdown Voltage According to the Change of JTE Structures and Design Parameters of 4H—SiC Device", j.inst.Korean.electr.electron.eng., Dec. 2015, vol. 19, No. 4, pp. 491-499.
(Continued)

*Primary Examiner* — Jonathan Han
(74) *Attorney, Agent, or Firm* — Fletcher Yoder, P.C.

(57) ABSTRACT

A silicon carbide (SiC) charge balance (CB) device includes a CB layer, which includes a first epitaxial (epi) layer. An active area of the first epi layer includes a first doping concentration of a first conductivity type and a first plurality of CB regions of a second conductivity type. A termination area of the first epi layer includes a minimized epi doping concentration of the first conductivity type. The SiC—CB device also includes a device layer, which includes a second epi layer disposed on the CB layer. An active area of the second epi layer includes the first doping concentration of the first conductivity type. A termination area of the device layer includes the minimized epi doping concentration of the first conductivity type and a first plurality of floating regions of the second conductivity type that form a junction termination of the device.

16 Claims, 8 Drawing Sheets

(51) Int. Cl.
*H01L 21/04* (2006.01)
*H01L 29/66* (2006.01)

(52) U.S. Cl.
CPC ...... *H01L 29/0623* (2013.01); *H01L 29/1608* (2013.01); *H01L 29/66068* (2013.01)

(58) Field of Classification Search
USPC .......... 257/E29.262, 133, 330; 438/270, 510
See application file for complete search history.

(56) References Cited

U.S. PATENT DOCUMENTS

| | | | |
|---|---|---|---|
| 9,595,609 | B2 | 3/2017 | Padmanabhan et al. |
| 9,704,949 | B1 | 7/2017 | Ghandi et al. |
| 2009/0090967 | A1* | 4/2009 | Chen ................. H01L 29/1095 257/330 |
| 2013/0140633 | A1* | 6/2013 | Pattanayak ........... H01L 21/266 257/341 |
| 2014/0027781 | A1* | 1/2014 | Ryu .................... H01L 27/0605 257/77 |
| 2017/0117354 | A1 | 4/2017 | Chen et al. |
| 2017/0278924 | A1* | 9/2017 | Bolotnikov ............. H01L 29/73 |
| 2018/0114852 | A1 | 4/2018 | Tipirneni et al. |

OTHER PUBLICATIONS

International Search ReportlWritten Opinion, PCT/US2019/068110, dated Apr. 29, 2020, 12 pages.

Temple, Victor A.K., et al.; "Junction Termination Extension for Near-Ideal Breakdown Voltage in p-n Junctions", IEEE Transactions on Electron Devices, vol. ED-33, No. 10, Oct. 1986, pp. 1601-1608.

Alatise, Olayiwola, et al.; "Super-Junction Trench MOSFETs for Improved Energy Conversion Efficiency", 2011 2nd IEEE PES International Conference and Exhibition on Innovation Smart Grid Technologies, pp. 1-5.

Chapter 10 of Fundamentals of Silicon Carbide Technology, 2014, 1-5.

Cho, Doohyung, et al.; "Epitaxial Junction Termination Extension (Epi-JTE) for SiC Power Devices", IEICE Transactions on Electronics, vol. E100-C, No. 5, May 2017, pp. 439-445.

Bolotnikov, Alexander, et al.; "SiC Charge-Balanced Devices Offering Breakthrough Performance Surpassing the 1D Ron versus BV Limit", European Conference on Silicon Carbide and Related Materials, 2018, pp. 1-4.

\* cited by examiner

SYSTEMS AND METHODS FOR TERMINATION IN SILICON CARBIDE CHARGE BALANCE POWER DEVICES

CROSS-REFERENCE TO RELATED APPLICATIONS

This application claims priority to U.S. Patent Provisional Application No. 62/783,683, entitled "SYSTEMS AND METHODS FOR JUNCTION TERMINATION IN SEMICONDUCTOR DEVICES", filed Dec. 21, 2018, which is herein incorporated by reference in its entirety.

BACKGROUND

The subject matter disclosed herein relates to silicon carbide (SiC) power devices and, more specifically, to SiC charge balance (CB) power devices.

For a semiconductor power device, a termination, such as a junction termination, can be used to generally prevent electric field crowding near the edges of an active area of the device during reverse bias operation. However, while terminations improve device reliability and operation, there is also a cost associated with using terminations. For instance, terminations generally occupy a certain amount of the die area of a semiconductor power device, referred to herein as a termination area. Along with other portions of the device (e.g., a gate bus region, a gate pad region, etc.), the termination area contributes to what is referred to herein as the overhead area of the device. As such, while the active area of the device includes device cells (e.g., metal-oxide-semiconductor field-effect transistors (MOSFET) cells) for power conversion, the overhead area includes features that support operation of these device cells.

Accordingly, it may be desirable to maximize a ratio of the active area to the overhead area of a device to enhance performance. A wide termination results in a large termination area, which results in a large overhead area, and this limits the amount of die area available for the active area of the device. Accordingly, by reducing the overhead area, the ratio of the active area to overhead area may be increased, which can improve the efficiency and/or operation of the device.

BRIEF DESCRIPTION

In an embodiment, a silicon carbide (SiC) charge balance (CB) device includes a first charge balance (CB) layer, which includes a first epitaxial (epi) layer. An active area of the first epi layer includes a first doping concentration of a first conductivity type and a first plurality of CB regions of a second conductivity type. Further, a termination area of the first epi layer includes a minimized epi doping concentration of the first conductivity type. The SiC—CB device also includes a device layer, which includes a second epi layer disposed on the first CB layer. An active area of the second epi layer includes the first doping concentration of the first conductivity type. A termination area of the device layer includes the minimized epi doping concentration of the first conductivity type and a first plurality of floating regions of the second conductivity type that form a first junction termination of the device.

In another embodiment, a method of manufacturing a silicon carbide charge balance (CB) device involves: forming a first CB layer. Forming the first CB layer involves forming a first epitaxial (epi) layer on an underlying layer. The first epi layer includes a minimized epi doping concentration of a first conductivity type. Forming the first CB layer may further involve implanting an active area of the first epi layer with a first doping concentration of the first conductivity type substantially greater than the minimized epi doping concentration. Additionally, forming the first CB layer may involve implanting the active area of the first epi layer with a first plurality of CB regions having a second conductivity type. The method of manufacturing the SiC—CB device further includes forming a device layer. Forming the device layer may involve forming a second epi layer on the first CB layer. The second epi layer includes the minimized epi doping concentration of the first conductivity type. Forming the device layer may also involve implanting an active area of the second epi layer with the first doping concentration of the first conductivity type. Further, forming the device layer may involve forming a first junction termination in the device layer by implanting a termination area of the second epi layer with a first plurality of floating regions having the second conductivity type.

In another embodiment, a SiC—CB device includes a first charge balance (CB) layer, which includes a first epitaxial (epi) layer. A termination area of the first epi layer includes a minimized epi doping concentration of a first conductivity type. Further, the SiC—CB device includes a device layer, which includes a second epi layer disposed on the first CB layer. A termination area of the device layer includes the minimized epi doping concentration of the first conductivity type and a plurality of floating regions of a second conductivity type that form a junction termination of the device.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
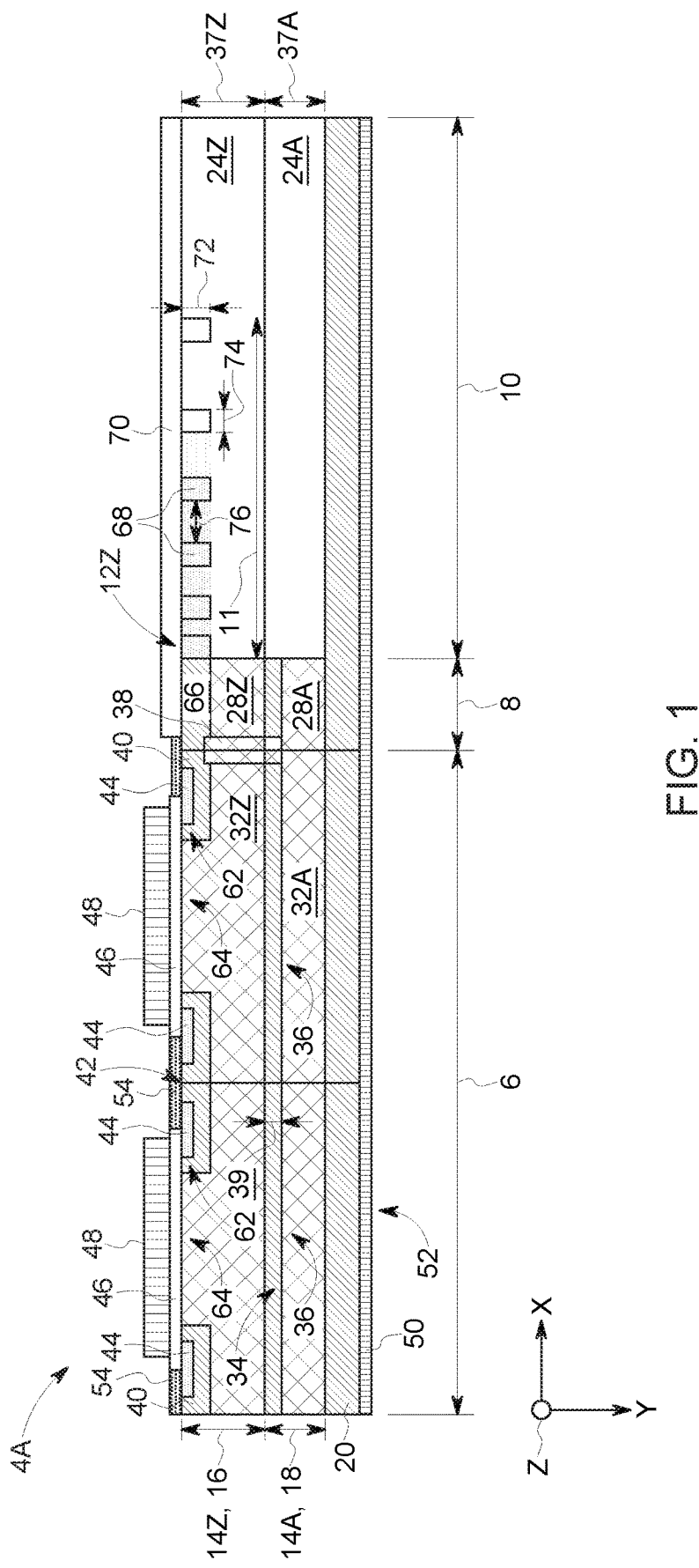
FIG. 1 is a schematic illustrating a cross-sectional view of a portion of a multi-layer silicon carbide charge balance (SiC—CB) device having an active area and having a termination area that includes floating regions of doping, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. If ranges are disclosed, the endpoints of all ranges directed to the same component or property are inclusive and independently combinable. The modifier "about" used in connection with a quantity is inclusive of the stated value and has the meaning dictated by the context (e.g., includes the degree of process variations or errors associated with measurement of the particular quantity). The modifier "substantially," when used in combination with a descriptive term, is intended to convey that the descriptive terms mostly, mainly, or predominately applies (e.g., applies to greater than 90%, greater than 95%, or greater than 99% of the time), and may be used to account for limited exceptions that may result from process variations and technical limitations understood by those of the art.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. As used herein, the term "disposed on" refers to layers disposed directly in contact with each other or indirectly by having intervening layers there between, unless otherwise specifically indicated. The term "adjacent" as used herein means that the two layers are disposed contiguously and are in direct contact with each other.

In the present disclosure, when a layer/device is being described as "on" another layer or substrate, it is to be understood that the layers/devices can either be directly contacting each other or have one (or more) layer or feature between the layers and devices. Further, the term "on" describes the relative position of the layers/devices to each other and does not necessarily mean "on top of" since the relative position above or below depends upon the orientation of the device to the viewer. Moreover, the use of "top," "bottom," "above," "below," "upper", "buried" and variations of these terms is made for convenience, and does not require any particular orientation of the components unless otherwise stated. With this in mind, as used herein, the terms "lower," "buried," "middle," or "bottom" refer to a feature (e.g., epitaxial layer, termination area) that is relatively nearer the substrate layer, while the terms "top" or "upper" refer to the particular feature (e.g., epitaxial layer, termination area) that is relatively the farthest from the substrate layer.

Present embodiments are directed toward designs and methods for manufacturing silicon carbide charge balance (SiC—CB) devices. The disclosed designs and methods are useful in the manufacture of SiC—CB devices, such as metal-oxide-semiconductor field-effect transistors (MOSFETs), junction field effect transistors (JFETs), bipolar junction transistors (BJTs), diodes, as well as other SiC—CB devices that may be useful for medium-voltage (e.g., 2 kV-10 kV) and high-voltage (e.g., greater than or equal to 10 kV) power conversion related applications. As discussed below, the disclosed SiC—CB device designs include multi-layered termination areas implemented using repeated epitaxial growth and dopant implantation steps. As used herein, the term "multi-layered," as well as references to a particular number of layers, for example, "two-layered," "three-layered," "four-layered," refer to the number of epitaxial SiC layers, also referred to herein as epi layers.

More specifically, present embodiments are directed toward designs and methods for manufacturing terminations, such as junction terminations, for silicon carbide charge balance (SiC—CB) devices. Generally, the disclosed termination designs satisfy a number of design parameters to provide effective termination (e.g., edge termination) for a SiC—CB device. For example, the disclosed termination designs provide a breakdown voltage that is close to device entitlement. The disclosed termination designs are also relatively robust to process variations (e.g., dopant concentration in the implanted regions, dopant concentration in the epitaxial layers, doping activation percentage, etc.). Additionally, the disclosed termination designs consume a relatively smaller portion of the die area, relative to typical junction termination designs, and are relatively low-cost to fabricate. For example, certain disclosed SiC—CB device embodiments may be manufactured using common semiconductor fabrication equipment, such as high-volume ion implantation systems used by existing Si/SiC device manufacturing, to provide additional cost benefits.

As discussed in detail below, the disclosed SiC—CB termination designs include one or more regions of n-type and/or p-type doping arranged in specific ways to form a junction termination, such as a junction termination extension (JTE), to allow gradual reduction of the magnitude of the electric field outside of the active area (e.g., a conductive region) of a SiC—CB device under high breakdown voltage operation. In various embodiments, these regions of doping may be implemented as disconnected blocks, continuous pillars, stripes, segments, grids, dots, or any other suitable shape. In certain embodiments, these regions of doping may be described as "floating," meaning that they are in not in electrical contact with a device terminal or under an external applied bias; however, in other embodiments at least a portion of these regions may be in electrical contact with a device terminal. The positions and dimensions of these implanted regions in the termination area of the disclosed SiC—CB devices are designed to achieve a high blocking voltage, to prevent premature device breakdown that results from electric field crowding effects, and to allow reliable operation of these devices particularly when subjected to long-term high-temperature/high-voltage operation. Moreover, by controlling the doping of epitaxial (epi) layers within the active area of a SiC—CB device using high-energy ion implantation, for example, and by controlling the doping of the termination area of the device, the disclosed termination designs occupy less die area than traditional junction termination designs, substantially increasing the active area to overhead area ratio without a performance penalty in terms of breakdown voltage.

With the foregoing in mind, FIG. 1 illustrates a cross-sectional view of an embodiment of a SiC—CB device 4A having an active area 6 and an intermediate area 8, as well as a termination area 10 having a junction termination, such as a junction termination extension (JTE) 12, in accordance with embodiments of the present approach. It may be appreciated that in order to more clearly illustrate certain components of the SiC—CB device 4A, certain commonly understood design elements (e.g., top metallization, passivation, and so forth) may be omitted.

The illustrated embodiment of the SiC—CB device 4A includes a number of epitaxial (epi) layers 14 that form a device layer 16 and a charge balance (CB) layer 18, among other features, of the SiC—CB device 4. While the illustrated embodiment includes two epi layers 14 (e.g., 14A and 14Z), the SiC—CB device 4A may include any suitable number of epi layers 14 (e.g., 3, 4, 5, 6, or more) to yield a SiC—CB device 4A having a particular desired voltage rating. In some embodiments, the epi layers 14 are generally formed from one or more wide-bandgap semiconductor materials, such as silicon carbide, gallium nitride, diamond, aluminum nitride, and/or boron nitride. The epi layers 14 may be fabricated using repeated cycles of epitaxial overgrowth. As illustrated, the first epi layer 14A is disposed above and adjacent to a substrate layer 20, and the second epi layer 14Z (e.g., the device epi layer) is disposed above and adjacent to the first epi layer 14A. In other embodiments, the SiC—CB device 4A may include additional epi layers 14 (e.g., 14B, 14C, 14D, and so forth), including any suitable number of CB layers 18, intervening between the first epi layer 14A and the device epi layer 14Z and/or disposed below the first epi layer 14A.

It may be appreciated that, for present embodiments, the epi layers 14 may be formed with the lowest controllable doping level, for example, without any intentional epi doping (e.g., without intentionally introducing any dopants). However, it is recognized since impurities, such as nitrogen, may be present in machinery and/or tools used during the epitaxial growth process, the epi layers 14 may still include a low amount of epi doping (e.g., of the first conductivity type), which is referred to herein a "minimized epi doping concentration." Accordingly, while the epi layers 14 may be formed with no intentional doping concentration, the actual epi doping concentration of epi layers 14 may be generally $8.0 \times 10^{13}$ cm$^{-3}$ or more, depending on the equipment used for epitaxial growth. For example, in certain embodiments discussed below, the minimized epi doping concentration of the first conductivity type (e.g., n-type) may be less than $5.0 \times 10^{15}$ cm$^{-3}$, less than $2 \times 10^{15}$ cm$^{-3}$, less than $1 \times 10^{15}$ cm$^{-3}$, or between $8 \times 10^{13}$ cm$^{-3}$ and $1 \times 10^{15}$ cm$^{-3}$.

As such, unlike other SiC devices, since the epi layers 14 begin with a minimized epi doping concentration, portions of the epi layers 14A and 14Z are subsequently implanted twice, once for each conductivity type, to achieve the desired structures (e.g., device structures, CB structures). After the first implantation of the first conductivity type, the device area 6 and intermediate area 8 of the SiC—CB device 4A have a particular doping concentration (e.g., greater than or equal to $5 \times 10^{15}$ cm$^{-3}$) of the first dopant type. For example, when the first conductivity type is n-type, nitrogen, phosphorous, arsenic, antimony, and/or the like may be used as the dopant. Alternatively, when the first conductivity type is p-type, boron, aluminum, and/or the like may be used as the dopant. Subsequently, a second implantation is used to form regions of the second conductivity type within portions of the active area 6 and the intermediate area 8.

Accordingly, termination regions 24 disposed in the termination area 10 of the SiC—CB device 4A may have a first doping concentration of the first conductivity type. Further, intermediate regions 28 disposed in the intermediate area 8 of the SiC—CB device 4A may have a second doping concentration of the first conductivity type. Moreover, active regions 32 disposed in the active area 6 of the SiC—CB device 4A may have a third doping concentration of the first conductivity type. For instance, as discussed in greater detail below, to define the active area 6 and the intermediate area 8, the doping concentration of the active regions 32 and the doping concentration of the intermediate regions 28 may be greater than the doping concentration of the termination regions 24. For example, in some embodiments, the doping concentration of the first conductivity type in the active regions 32 and the intermediate regions 28 may be greater than or equal to $5 \times 10^{15}$ per cubic centimeter (cm$^{-3}$), such as $1.0 \times 10^{16}$ cm$^{-3}$. For such embodiments, the doping concentration of the first conductivity type in the termination regions 24 (e.g., the minimized epi doping concentration) may be less than or equal to $2.0 \times 10^{15}$ cm$^{-3}$. Moreover, within a certain device area (e.g., the termination area 10, the intermediate area 8, and/or the active area 6,) the doping concentration of the first conductivity type in the portions of the epi layers (e.g., the termination regions 24, the intermediate regions 28, and/or the active regions 32, respectively) may be the same or different.

For the embodiment illustrated in FIG. 1, in the active area 6, a top surface 42 of the device layer 16 includes a well region 40 having a second conductivity type (e.g., a p-well region 40) disposed adjacent to a source region 44 having the first conductivity type (e.g., n-type source region 44). A dielectric layer 46 (also referred to as a gate insulating layer or gate dielectric layer) is disposed adjacent to the device layer 16, and a gate electrode 48 is disposed adjacent to the dielectric layer 46. Further, the CB layer 18 is disposed on the substrate layer 20 (e.g., a semiconductor substrate layer, a wide band gap substrate layer), and a drain contact 50 is disposed on the bottom 52 of the SiC—CB device 4A, adjacent to the substrate layer 20. As additionally illustrated in the embodiment of FIG. 1, a source contact 54 is disposed adjacent to the top surface 42 of the device layer 16, and is disposed on a portion of both the source region 44 and the well region 40 of the device layer 14.

During on-state operation of the illustrated SiC—CB device 4A, an appropriate gate voltage (e.g., at or above a threshold voltage ($V_{TH}$) of the SiC—CB device 4A) causes an inversion layer form in a channel region 62, as well as a conductive path to be enhanced in a junction field-effect transistor (JFET) region 64, due to accumulation of carriers, allowing current to flow from the drain contact 50 (e.g., drain electrode, drain terminal) to the source contact 54 (e.g., source electrode, source terminal) within portions of the active area 6 and/or in the intermediate area 8. The channel region 62 may be generally defined as an upper portion of the well region 40 disposed below the gate electrode 48 and the dielectric layer 46.

To reduce on-state resistance (Rds(on)) and resultant on-state conduction losses, the SiC—CB device 4A includes the CB layer 18 formed in the active region 32A and the intermediate region 28A of the first epi layer 14A. The CB layer 18 includes a set of CB regions 34 implanted in the active region 32A and the intermediate region 28A. Within the CB layer 18, the CB regions 34 are oppositely doped relative to the remainder 36 of the active region 32A and intermediate region 28A. In other words, for SiC—CB devices 4 having n-type active regions 32 and/or intermediate regions 28, the CB regions 34 are p-type, and for SiC—CB devices 4 having p-type active regions 32A and/or intermediate regions 28, the CB regions 34 are n-type. Further, the CB regions 34 and the remainder 36 of the active region 32A and intermediate region 28A are each generally designed to substantially deplete and to generally provide similar amounts (e.g., substantially equal amounts) of effective charge (e.g., per $cm^2$, normalized to device active area 6) from ionized dopants under reverse bias. The illustrated charge balance structure allows the SiC—CB device 4A to achieve high breakdown voltage and low on-state resistance, since the p-type semiconductor portions and the n-type semiconductor portions are both completely depleted under nominal blocking conditions.

In some embodiments, the disclosed CB regions 34 and CB layer 18 may have one or more properties (e.g., doping, width, depth, spacing, etc.), as described for floating charge balance regions in U.S. Pat. No. 9,735,237, entitled, "ACTIVE AREA DESIGNS FOR SILICON CARBIDE SUPER-JUNCTION POWER DEVICES," filed Jun. 26, 2015, the disclosure of which is hereby incorporated by reference in its entirety for all purposes. For example, in some embodiments, the thicknesses 37A and 37Z of each of the epi layers 14A and 14Z is less than or equal to 20 μm, such as between 5 μm and 20 μm, between 2 μm and 12 μm, between 5 μm and 12 μm, between 10 μm and 12 μm, or the like. Additionally, the thickness 39 of the CB regions 34 is in the range of 0.5 μm to 1.0 μm. For such embodiments, the dopant concentration of the CB regions 34 may be between $2 \times 10^{16}$ per centimeters cubed ($cm^{-3}$) and $1 \times 10^{18}$ $cm^{-3}$. More specifically, in some embodiments, because the CB regions 34 may be implanted with a variable distribution of dopant concentrations, the CB regions 34 may be described as having an integrated charge (e.g., dose) of approximately $2 \times 10^{13}$ per square centimeter ($cm^{-2}$) (e.g., +/−20% and/or +/−50%). The integrated charge may be determined and/or adjusted based in part on the depth at which the CB regions 34 are implanted and/or the implant acceleration energy used to implant the CB regions 34. In such embodiments, the portion of the epi layers 14 within the active area 6 and/or the intermediate area 8 (e.g., the active regions 32 and/or the intermediate regions 28, respectively) may be doped to a doping concentration greater than or equal to $5 \times 10^{15}$ $cm^{-3}$, which may yield a device having a particular on resistance (e.g., less than 7 milliohms per square centimeter (mOhm/$cm^2$) and a particular breakdown voltage (e.g., greater than 3 kV, greater than 4.5 kV). In some embodiments, the doping concentration of the set of CB regions 34 divided by the thickness of the CB regions 34 may be greater than or equal to $5 \times 10^{12}$ $cm^{-2}$ and less than or equal to approximately $1 \times 10^{14}$ $cm^{-2}$. Accordingly, in such embodiments, the set of CB regions 34 may have a doping concentration between $5 \times 10^{16}$ $cm^{-3}$ and $2 \times 10^{18}$ $cm^{-3}$. Moreover, in some embodiments, the SiC—CB device 4A may include fewer or additional CB layers 18 (e.g., two CB layers 18, three CB layers 18, four CB layers 18, and/or the like) to achieve a desired voltage rating, for example.

Further, it should be appreciated that the doping of the epi layers 14, the doping of the CB regions 34, the thicknesses 37 of the epi layers 14, the thickness 39 of the CB regions 34, among other properties, may be varied for different embodiments to enable desired electrical performance (e.g., desired breakdown voltage) of the SiC—CB devices 4. For example, in some embodiments, certain device parameters (e.g., the thicknesses 37 and doping of the epi layers 14) may be selected to provide a breakdown voltage of the SiC—CB device 4A that is between approximately 1 kilovolt (kV) and 10 kV, 1 kV and 5 kV, or any other suitable range.

Additionally, the illustrated embodiment of the SiC—CB device 4A includes a charge balance (CB) bus 38 electrically coupled to at least a portion of the CB regions 34. The CB bus 38 has the same conductivity type as the CB regions 34, which is opposite the conductivity type implanted into the remainder 36 of the active regions 32 and/or the intermediate regions 28. Accordingly, for SiC—CB devices 4 having n-type active regions 32 and/or intermediate regions 28, the CB bus 38 and CB regions 34 are p-type, and for SiC—CB devices 4 having p-type active regions 32 and/or intermediate regions 28, the CB bus 38 and CB regions 34 are n-type. Further, the doping concentration of the CB bus 38 may be the same or different as the set of CB regions 34 of the CB layer 18. Moreover, as illustrated, the CB bus 38 is in contact with, and electrically coupled to, the well region 40 of the device layer 16 having the same conductivity type as the CB bus 38, an intermediate well region 66 having the same conductivity type as the CB bus 38, and the CB regions 34. The CB bus 38 may be implanted into a portion of each of the epi layers 14. In particular, the disclosed CB bus 38 may extend vertically (e.g., along the Y-axis) from one or more well regions 40 and/or from one or more features near a top surface 42 of the device layer 16 (e.g., intermediate well regions 66) to at least a portion of the CB regions 34. Accordingly, the illustrated CB bus 38 connects (e.g., electrically couples) the well region 40 to at least a portion of the CB regions 34.

In some embodiments, the disclosed CB bus 38 may have one or more properties (e.g., doping, width, depth, etc.), as described for the connection region in the co-pending U.S. patent application Ser. No. 15/077,579, entitled, "SUPER-JUNCTION SEMICONDUCTOR POWER DEVICES WITH FAST SWITCHING CAPABILITY," filed Mar. 22, 2016, the disclosure of which is hereby incorporated by reference in its entirety for all purposes. For example, in some embodiments, the width of the CB bus 38 along the X-axis may be between 1 μm and 5 μm. Further, in some embodiments, the doping concentration of the CB bus 38 may be between $5 \times 10^{15}$ $cm^{-3}$ and $1 \times 10^{17}$ $cm^{-3}$, such as between $5 \times 10^{15}$ $cm^{-3}$ and $4 \times 10^{16}$ $cm^{-3}$ and/or between $1 \times 10^{16}$ $cm^{-3}$ and approximately $1 \times 10^{17}$ $cm^{-3}$.

For the embodiment illustrated in FIG. 1, the termination area 10 includes a junction termination, such as a JTE 12, having the second conductivity type implanted in the termination region 24Z. In some embodiments, the JTE 12 includes a number of implanted regions of a dopant having the second conductivity type (e.g., p-type), that extend a width 11 from the intermediate area 8 and are utilized to reshape the electric field in at least the termination area 10 SiC—CB device 4. In certain embodiments, these implanted regions include floating regions 68, which are be implemented in the form of disconnected, implanted dopant blocks in the SiC—CB device 4A of FIG. 1. When the floating regions 68 are arranged as disclosed, they gradually reduce the strength of the electric field outside of the active area 6 of the SiC—CB device 4A during high-voltage blocking operation. Additionally, the SiC—CB device 4A may also include a number of passivation layers 70 disposed on the device layer 16 in the termination area 10, which may be formed from one or more dielectric materials that aid in reducing the electric field above the device layer 16.

As mentioned, the floating regions 68 of the illustrated SiC—CB device 4A are regions having opposite conductivity type relative to the minimized epi doping of the epi layer 14Z (e.g., the termination region 24Z), in which they reside. When the embodiment of the SiC—CB device 4A illustrated in FIG. 1 is in an OFF-state under reverse bias, floating regions 68 deplete to provide ionized dopants (immobile charges) that, when suitably sized, shaped, and positioned relative to the X-axis and the Z-axis, allow the electric field to be reshaped within periphery of the SiC—CB device 4A (e.g., within the termination area 10). More specifically, when floating regions 68 deplete under reverse bias, they prevent electric field peaks and provide electric field distributions with a magnitude that gradually decreases with increasing distance from the active area 6 of the SiC—CB device 4A. The particular electric field distribution in the termination area 10 of the SiC—CB device 4A under reverse bias depends, for example, on the distribution of dopants (e.g., dopant concentration, the dimensions and positions of the floating regions 68).

For the embodiment of the SiC—CB device 4A illustrated in FIG. 1, the floating regions 68 have a particular depth 72. In other embodiments, the floating regions 68 may extend through the entire thickness of the device epitaxial layer 14Z (e.g., thickness 37Z). Additionally, for the illustrated embodiment of FIG. 1, the widths 74 of the floating regions 68, and the spacing 76 between the floating regions 68 in the termination area 10 changes (e.g., decreases or increases) with increasing distance from the active area 6 of the SiC—CB device 4A to provide a gradual decrease in effective sheet doping concentration in the termination area 10. It may be appreciated that, in other embodiments, the widths 74 of the floating regions 68 substantially decrease with increasing distance from the active area 6, while the spacing 76 between the floating regions 68 remains substantially constant. In still other embodiments, the spacing 76 between the floating regions 68 substantially increases with increasing distance from the active area 6, while the widths 74 of the floating regions 68 remains substantially constant. Further, in certain embodiments, as described below with reference to FIG. 5, the SiC—CB device may include at least one additional JTE 12 in at least one buried epi layer (e.g., CB layer 18). In such embodiments, the floating regions 68 of each epi layer 14A and 14Z may have different depths 72, widths 74, and spacing 76. Additionally, in certain embodiments, multiple masking/lithographic steps may be used to fabricate the JTE 12 of each epi layer 14.

Moreover, in some embodiments, the disclosed floating regions 68 may have one or more properties (e.g., doping, width, depth, spacing, etc.), as described for floating regions in the co-pending U.S. patent application Ser. No. 16/060,549, entitled, "EDGE TERMINATION DESIGNS FOR SILICON CARBIDE SUPER-JUNCTION POWER DEVICES," filed Jun. 8, 2018, the disclosure of which is hereby incorporated by reference in its entirety for all purposes. For example, in some embodiments, the widths 74 of each of the floating regions 68 may be between 0.8 microns ($\mu$m) and approximately 5 $\mu$m, while the spacing 76 between the floating regions 68 may generally be less than the thickness of the respective epi layer 14 the floating regions 68 are disposed within (e.g., the thickness 37Z of the device epi layer 14Z). Further, the depth 72 of each of the floating regions 68 may be approximately 1 $\mu$m. Moreover, the integrated charge (e.g., dose) of the JTE 12 may be between $6\times10^{12}$ cm$^{-2}$ and $3\times10^{13}$ cm$^{-2}$. For example, in some embodiments, the integrated charge of the device layer JTE 12Z may be $1.6\times10^{13}$ cm$^{-2}$.

Additionally or alternatively, in some embodiments, the disclosed JTE 12 and/or floating regions 68 may have one or more properties (e.g., doping, width, depth, spacing, etc.), as described for the JTE and/or the discrete regions, respectively, in the U.S. Pat. No. 9,406,762, entitled, "SEMICONDUCTOR DEVICE WITH JUNCTION TERMINATION EXTENSION," filed May 15, 2013, the disclosure of which is hereby incorporated by reference in its entirety for all purposes. For example, in some embodiments, the effective doping profile of the JTE 12 monotonically decreases as a function of the distance from the intermediate region 8 along the X-axis. That is, for example, each of the floating regions 68 may be separated from another floating region by a respective spacing 76 and/or a respective additional spacing 80 illustrated in FIG. 2 such that the doping profile of the JTE 12 generally decreases with increasing distance from the intermediate region 8 along the X-axis.

The JTE 12 described herein provides an illustrative example of a junction termination, and more specifically, the JTE 12 described herein depicts an illustrative example of a graded zone JTE. However, in some embodiments, the implanted regions having the second conductivity type (e.g., p-type), such as the floating regions 68, may additionally or alternatively be implemented to have one or more properties corresponding to another termination and/or junction termination structure. For instance, the implanted regions may be implemented as a single zone JTE, which may include a single implanted region in contact with the intermediate well region 66, and/or as a multiple zone JTE, which may include two or more connected implanted regions. In some embodiments, the two or more connected implanted regions may have the same or different properties, and at least one of the two or more connected implanted regions may contact the intermediate well region 66. Additionally, in some embodiments, the implanted regions may be implemented to form a multiple floating zone JTE. In such embodiments, a first implanted region may contact the intermediate well region 66, while a set of additional implanted regions, such as the floating regions 68, having different spacing and/or widths may be implanted disconnected from the first implanted region and from one another. Further, in some embodiments, the implanted regions (e.g., the floating regions 68) may be implemented to form a floating field ring (FFR) termination. In such embodiments, the floating regions 68 may be implanted disconnected from one another and disconnected from the intermediate well region 66. Additionally or alternatively, the implanted regions may be implemented to form a space modulated JTE, which may include a first implanted region in contact with the intermediate well region and disconnected from a set of additional implanted regions implanted to form a FFR. Accordingly, it may be appreciated that techniques described herein may be applied to any suitable junction termination, such as a single zone JTE, a multiple zone JTE, a graded JTE, a multiple floating zone JTE, a FFR, a space modulated JTE, and/or the like, and that embodiments described herein are intended to be illustrative and not limiting.

Figure 2:
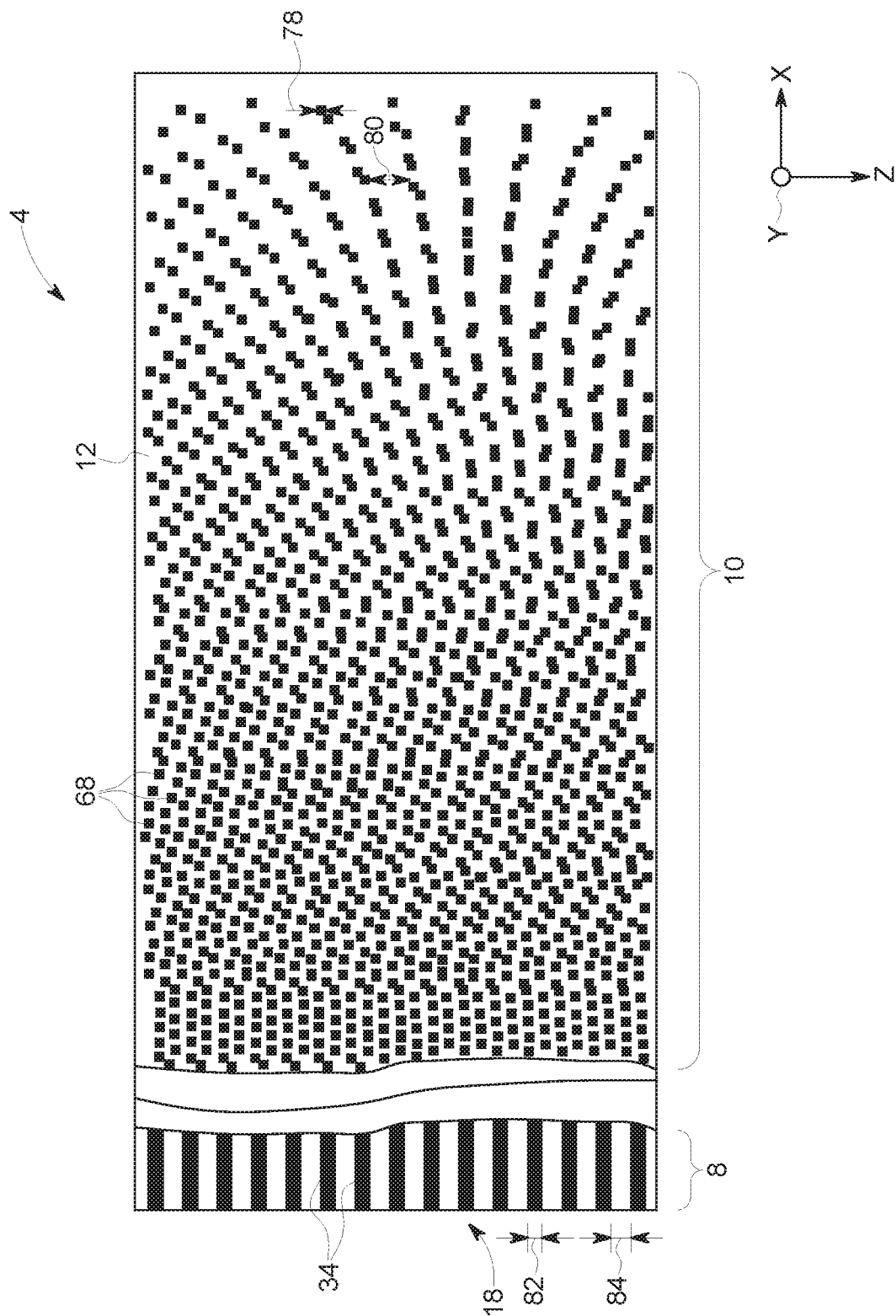
FIG. 2 is a top-down view of the portion of the multi-layer SiC—CB device of FIG. 1, in accordance with an embodiment.

FIG. 2 illustrates a top-down view (perpendicular to the schematic of FIG. 1) of the SiC—CB device 4A, in accordance with embodiments of the present approach. More specifically, FIG. 2 illustrates a top-down view of an embodiment of a SiC—CB device 4B having a termination area 10 that includes floating regions 68, implemented as disconnected blocks of doping. In particular, FIG. 2 illustrates top-down views of the device layer JTE 12Z and a cut-away revealing the CB layer 18. For simplicity, the device layer JTE 12Z and the CB layer 18 are illustrated in the same top-down view. However, it may be appreciated that the CB layer 18 may be disposed at a different depth (e.g., along the Y-axis) compared to the device layer JTE 12Z, as indicated by the cut-away.

For the embodiment illustrated in FIG. 2, each floating region 68 has a particular length 78, as well as additional spacing 80 along the Z-axis. In some embodiments, the length 78 of each floating region 68 may be between 0.8 μm and approximately 5 μm, while the additional spacing 80 between the floating regions 68 may generally be less than the thickness 37 of the respective epi layer 14 the floating regions 68 are disposed within (e.g., the thickness 37Z of the device epi layer 14Z). While the floating regions 68 are illustrated as disconnected blocks, the floating regions 68 may be implemented as disconnected blocks, continuous pillars, stripes, segments, grids, dots, or any other suitable shape. Accordingly, the length 78 and additional spacing 80 between floating regions 68 may vary between certain embodiments. Moreover, as described above, the floating regions 68 may be implemented with properties (e.g., length 78, additional spacing 80, and/or the like) to form an alternative termination and/or junction termination structure. As such, embodiments disclosed herein are intended to be illustrative and not limiting.

As further illustrated, each of the CB regions 34 may be described as having a particular width 82 and a particular spacing 84. In some embodiments, the width 82 of each of the CB regions 34 is between 0.1 μm and 2 μm, and the spacing 84 between the CB regions 34 is between 1 μm and 6 μm. However, as discussed above, the dimensions (e.g., thickness 39, width 82, and/or spacing 84) of the CB regions 34 may be varied for different embodiments to enable desired electrical performance (e.g., desired breakdown voltage) of the SiC—CB device 4. Further, in certain embodiments, the dimensions (e.g., thickness 39, width 82, and/or spacing 84) of the CB regions 34 may be different in different CB layers 18. In different embodiments, the CB regions 34 may have different cross-sectional shapes (e.g., defined by an implantation mask and/or implantation energies/doses). For some embodiments, the shape of the CB regions 34 may not substantially vary along the Y-axis.

Figure 3:
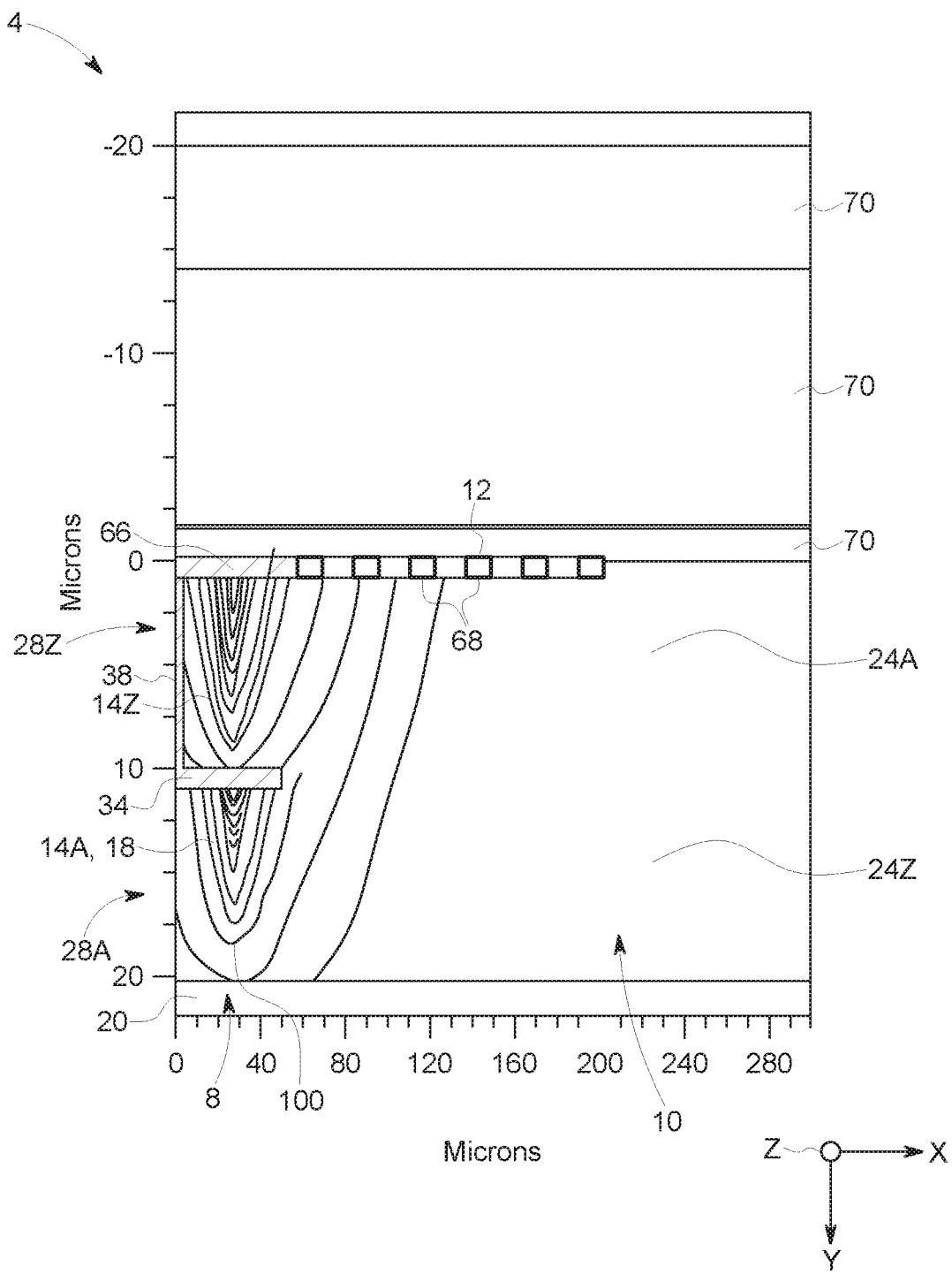
FIG. 3 is a schematic illustrating the termination area for an embodiment of the SiC—CB device of FIG. 1, including equal rate lines demonstrating the impact ionization rate present under reverse bias conditions, in accordance with an embodiment.

Turning now to FIG. 3, a cross-sectional view of an embodiment of a portion of a SiC—CB device 4A having the JTE 12 is illustrated. Additionally, FIG. 3 includes equal rate lines 100 that indicate an impact generation rate (e.g., impact ionization rate) present in different regions of the SiC—CB device 4A under reverse bias conditions. It may be noted that the impact generation rate is represented as being higher (e.g., greater) when the rate lines 100 are close to one another and lower when there is larger spacing between the rate lines 100.

In some embodiments, shaping the electric fields of the SiC—CB device 4A may involve forming the JTE 12 such that avalanche breakdown, a result of impact-ionization, occurs outside of the termination area 10 (e.g., within the active area 6 and/or the intermediate area 8) at nominally rated voltages. That is, for example, avalanche breakdown may be isolated to the active area 6 and/or the intermediate area 8, which may maximize the breakdown voltage of the SiC—CB device 4A, enabling a breakdown voltage that is close to device entitlement. Accordingly, as illustrated, the impact generation rates are highest at the charge balance regions 34 and the well region 66 in the intermediate area 8 and decrease outward from these regions. As such, using the disclosed JTE design, the impact generation rates within the termination area 10 are minimized and may gradually decrease with increasing distance from the intermediate area 8 and/or the active area 6.

Figure 4:
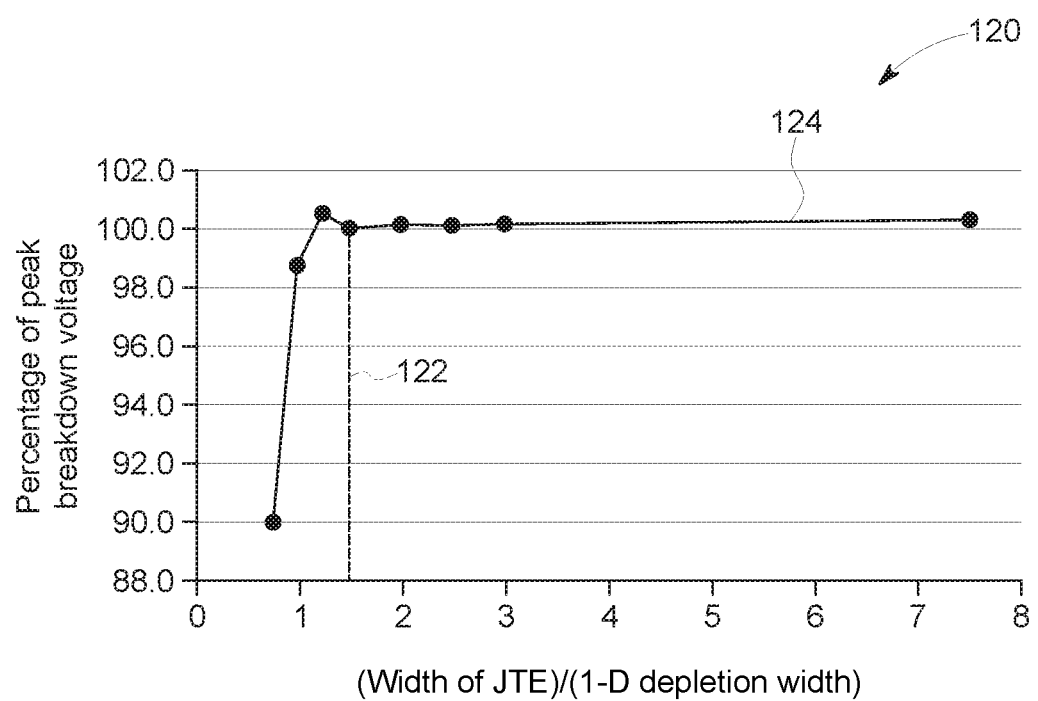
FIG. 4 is a graph that plots percentage of a peak breakdown voltage achievable as a function of a ratio of the junction termination extension (JTE) width to the one dimensional (1-D) depletion width of the device for an example SiC—CB device, in accordance with an embodiment.

Returning briefly to FIG. 1, it may be appreciated that in a conventional SiC device (e.g., a SiC device having an epi doping of $5.0 \times 10^{15}$ cm$^{-3}$ or more in the termination region), in order to contain the avalanche breakdown within the active area 6 and/or the intermediate area 8, the width 11 of the JTE 12 may be greater than or equal to five times the one dimensional (1-D) depletion width of the device, wherein the 1-D depletion width may be approximated as the depth of the active area 6 (e.g., the sum of the thicknesses 37 of the epi layers 14). That is, for example, the ratio of the width 11 of the JTE 12 to the 1-D depletion width of the device may be 5:1. However, as shown in the graph 120 illustrated in FIG. 4, to reach a peak (e.g., maximum) breakdown voltage in a SiC—CB device 4A having one or more CB layers 18 and termination regions 24 having a minimized epi doping concentration, the ratio of the width 11 of the JTE 12 to the 1-D depletion width of the SiC—CB device 4A may be substantially reduced. As such, by using the disclosed JTE design, it is presently recognized that the ratio of the active area 6 of the SiC—CB device 4A to the overhead area (e.g., including the termination area 10) may be increased for the SiC—CB device 4A. Accordingly, the die area available for the active area 6 may be increased.

More specifically, the graph 120 plots an example of a percentage of a peak breakdown voltage achievable by the SiC—CB device 4A, wherein the device has a particular ratio for the width 11 of the JTE 12 (e.g., width of the termination area 10) to the 1-D depletion width of the device. To the left of the line 122 (e.g., for a ratio of the width 11 of the JTE 12 to the 1-D depletion width of the device below about 1.5), the avalanche breakdown occurs at the JTE 12 (e.g., the termination area 10) and/or at the intersection of the JTE 12 and the intermediate well region 66. Further, in some embodiments, the plotted curve 124 may include a peak exceeding 100% of the peak breakdown voltage. This peak indicates a transition from the avalanche breakdown occurring within the JTE 12 to within a combination of the JTE 12 and the active area 6 and/or intermediate area 8. To the right of the line 122 (e.g., for a ratio of the width 11 of the JTE 12 to the 1-D depletion width of the device greater than or equal to about 1.5), the avalanche breakdown desirably occurs at the active area 6 and/or the intermediate area 8, rather than in the termination area 10 of the SiC—CB device 4A. Accordingly, embodiments of the SiC—CB device 4A having a ratio of the width 11 of the JTE 12 to the 1-D depletion width of the device greater than or equal to about 1.5 may achieve the maximum breakdown voltage (e.g., 100% of the peak breakdown voltage) of the SiC—CB device 4.

Figure 5:
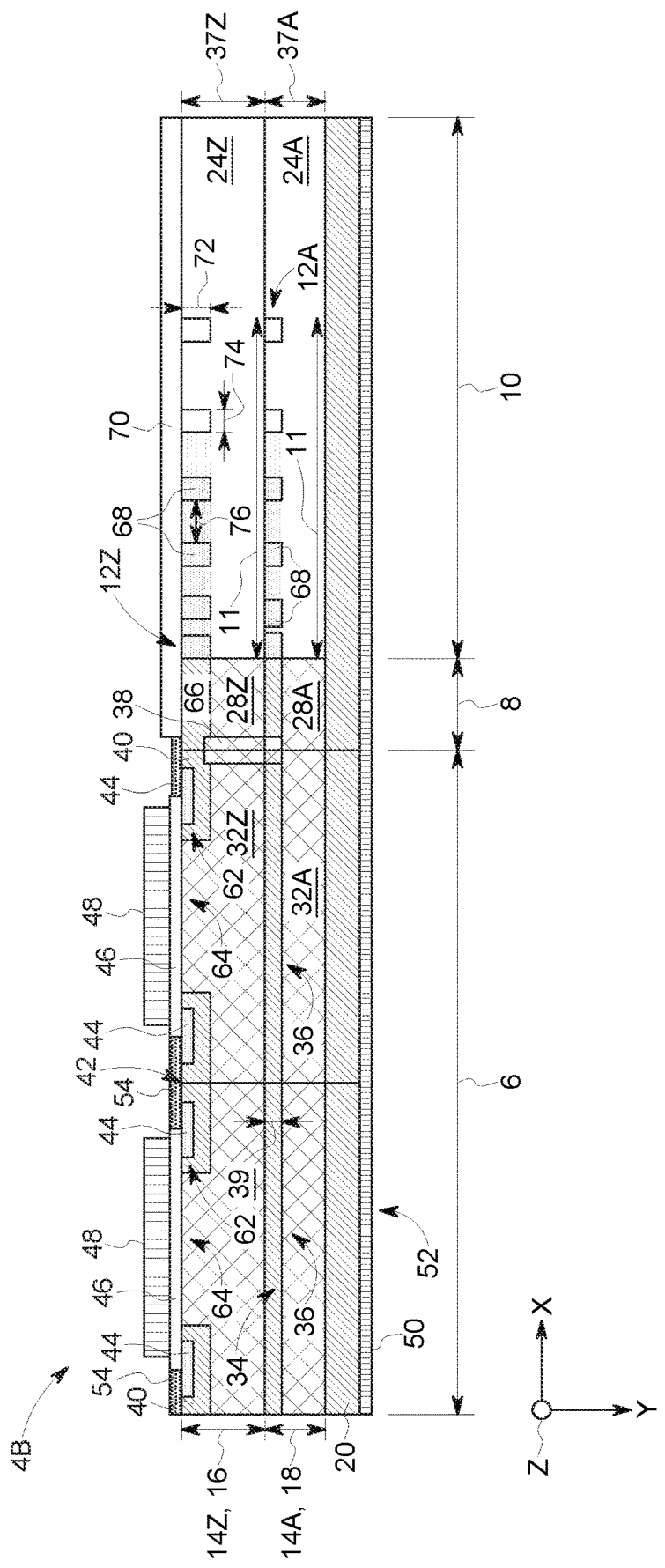
FIG. 5 is a schematic illustrating a cross-sectional view of a portion of another example of the multi-layer SiC—CB device having a termination area that includes a first junction termination and a second junction termination, in accordance with an embodiment.

Turning now to FIG. 5, in some embodiments, the disclosed SiC—CB devices 4 may include multiple junction terminations, such as multiple JTEs 12. For example, as illustrated, the SiC—CB device 4B includes a first JTE 12A in the same epi layer 14A as the CB layer 18 and a second JTE 12Z (e.g., a device JTE) in the same epi layer 14Z as the intermediate well region 66 (e.g., the device layer 16). In some embodiments, the doping profile of the first JTE 12A may be the same as the doping profile of the device layer JTE 12Z. However, in other embodiments, the doping profile of the first JTE 12A may differ from the doping profile of the JTE 12A. For example, in some embodiments, the integrated charge (e.g., dose) of the first JTE 12A may be lower than the integrated charge of the device layer JTE 12Z. For instance, the first JTE 12A may have an effective dose of $9.0 \times 10^{12}$ per square centimeter ($cm^{-2}$), while the device layer JTE 12Z may have an effective dose of $1.6 \times 10^{13}$ $cm^{-2}$. In such embodiments, the first JTE 12A may be implanted concurrently with the CB layer 18 (e.g., with the CB regions 34). For instance, the floating regions 68 of the first JTE 12A may be implanted with the same dopant type (e.g., a p-type or n-type dopant), utilizing the same materials (e.g. Al, B, N, P, etc.), and using the same dose/energy during the same ion implantation step used to implant the set of CB regions 34, which may reduce fabrication time and cost. In other embodiments, the floating regions 68 of the first JTE 12 are implanted using a different dopant material and/or dose/energy, which may increase the fabrication time and cost, but enables greater flexibility in the design (e.g., dopant material, effective integrated charge, and/or the like) of the first JTE 12A.

Further, as described above, the SiC—CB device may include any number of epi layers 14 and/or CB layers 18. Accordingly, while the illustrated embodiment includes two JTEs 12 (e.g., 12A and 12Z), it may be appreciated that in some embodiments, the SiC—CB device 4B may include a respective JTE 12 (e.g., 12B, 12C, 12D, and so forth) in each epi layer 14, including CB layer 18. Alternatively, the SiC—CB device 4B may include a JTE 12 for each of a set of epi layers 14, such that a JTE 12 is adjacent to every other epi layer 14, every third epi layer 14, and/or the like. Thus, embodiments described herein are intended to be illustrative and not limiting.

Figure 6:
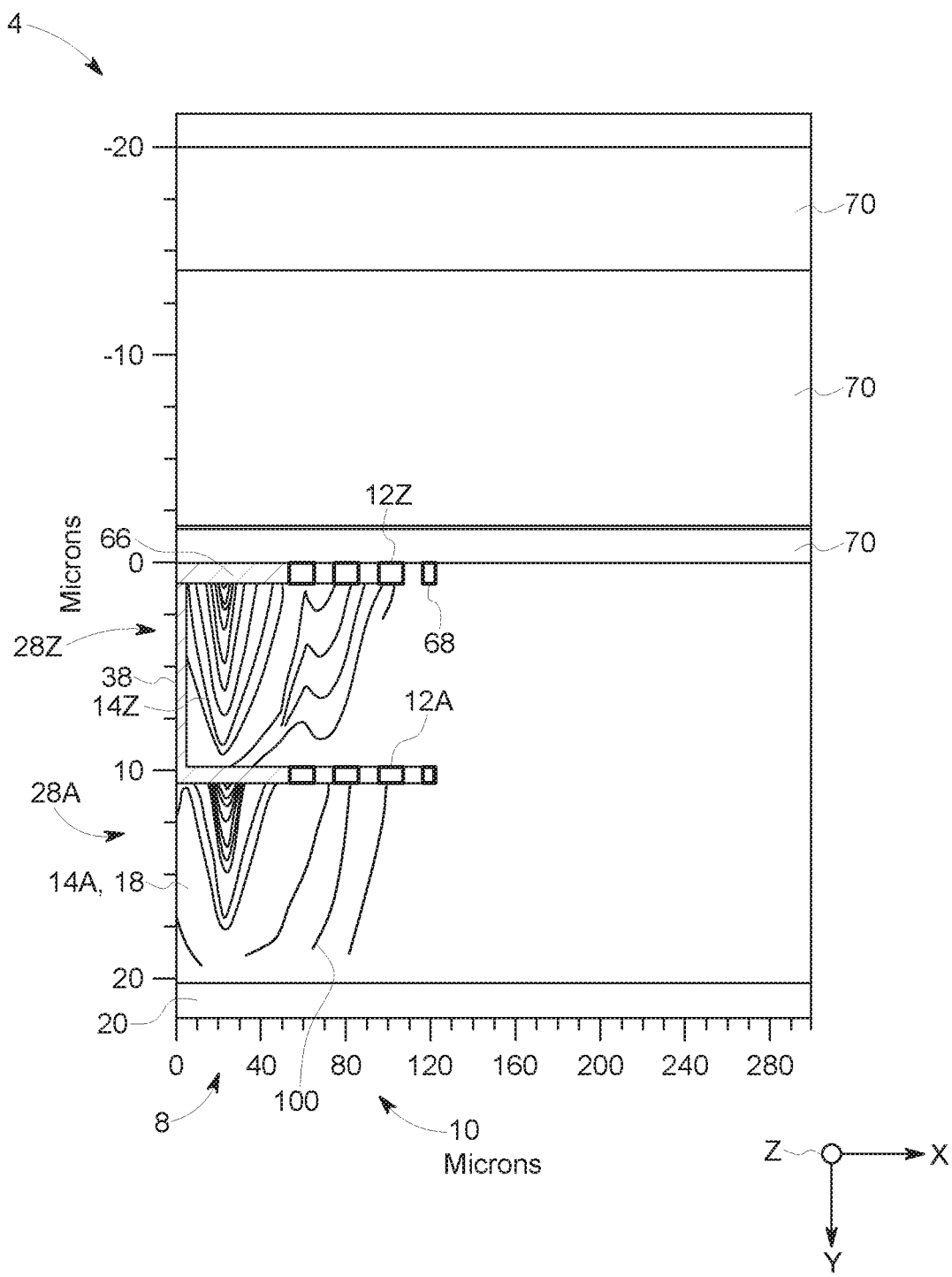
FIG. 6 is a schematic illustrating a cross-sectional view of the termination area for an embodiment of the SiC—CB device of FIG. 5, including equal rate lines demonstrating the impact ionization rate present under reverse bias conditions, in accordance with an embodiment.

Moreover, as described herein, the electric fields of the SiC—CB device 4B may be shaped based in part on the JTE 12 (e.g., 12A, 12Z), which may influence the location of avalanche breakdown within the SiC—CB device 4B. Accordingly, to demonstrate the effect of multiple JTEs 12 on the avalanche breakdown of the SiC—CB device 4, FIG. 6 illustrates a cross-sectional view of a portion of an embodiment of a SiC—CB device 4B having a first JTE 12A and a device layer JTE 12Z. Additionally, FIG. 6 includes equal rate lines 100 that indicate an impact generation rate (e.g., impact ionization rate) present in different regions of the SiC—CB device 4B under reverse bias conditions, as described with reference to FIG. 3. As further described with reference to FIG. 3, the impact generation rate is represented as being higher (e.g., greater) when the rate lines 100 are close to one another and lower when there is larger spacing between the rate lines 100.

In the illustrated embodiment, avalanche breakdown occurs mainly in the CB layer 18 and the device epi layer 14Z (e.g., at the intermediate well region 66), as demonstrated by the closely spaced rate lines 100, indicating the highest impact generation rates. Further, as described above with reference to FIG. 3, the impact generation rates of the SiC—CB device 4B gradually decrease moving outwardly from the CB layer 18 and the intermediate well region 66. Further, in some embodiments, because the effective dose of the device layer JTE 12Z is greater than the effective dose of the first JTE 12A, the impact generation rates may decrease more rapidly in the termination region 24Z than the termination region 24A. Accordingly, the impact rate generation profile of the termination area 10 the illustrated embodiment varies from that of the embodiment illustrated in FIG. 3.

For the embodiment illustrated in FIG. 6, the width 11 of each of the illustrated device layer JTE 12Z and the first JTE 12A is approximately 50 microns (μm). Accordingly, while the illustrated impact generation rates in the termination region 24A of FIG. 6 are greater than the impact generation rates of the termination region 24A of FIG. 3, the ratio of the active area 6 to the termination area 10 of the embodiment illustrated in FIG. 6 is greater than the embodiment illustrated in FIG. 3. Accordingly, the certain parameters of the termination area 10 (e.g., width 11, number of JTEs 12, and doping concentration, among other properties) may be varied for different embodiments to enable desired electrical performance (e.g., desired breakdown voltage, ratio of active area 6 to termination area 10, and/or the like) of the SiC—CB device 4. For example, as described in greater detail below, the termination area 10 having a single device layer JTE 12Z may be designed with termination regions 24 having a first minimized epi doping concentration, while a termination area 10 having multiple JTEs 12 may be designed with termination areas 24 having a second minimized epi doping concentration that is greater than (e.g., includes a greater tolerance to unintentional epi doping) the first minimized epi doping concentration.

Figure 7:
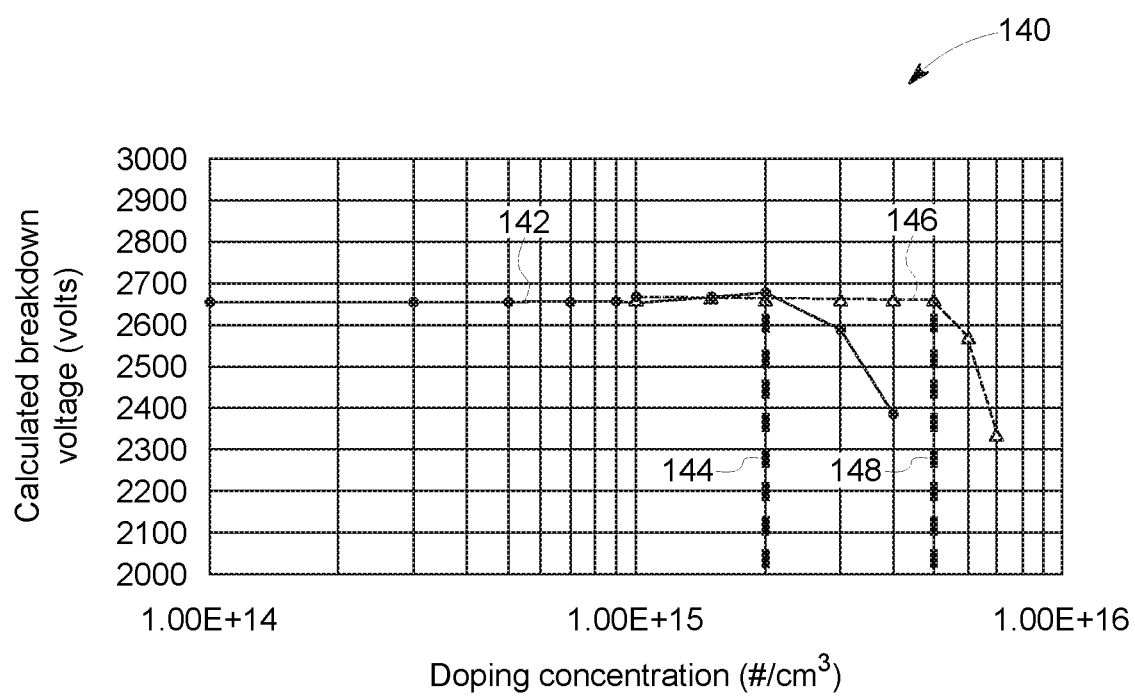
FIG. 7 is a graph illustrating breakdown voltage of the SiC—CB device as a function of doping concentration per cubic centimeter (cm$^{-3}$) of the termination area for different SiC—CB device structures, in accordance with an embodiment.

As set forth above, the termination regions 24 (e.g., 24A, 24Z) may have a minimized epi doping concentration this is substantially lower than the doping concentration of the first conductivity type in the active regions 32 and/or the intermediate regions 28 of the device. In some embodiments, along with the width of the JTE 12, the doping concentration of the termination regions 24 may influence the maximum breakdown voltage of the SiC—CB devices 4 and/or the location of avalanche breakdown within the SiC—CB devices 4. To demonstrate this relationship, the graph 140 shown in FIG. 7, illustrates an example of a breakdown voltage of SiC—CB devices 4A and 4B as a function of epi doping concentration (in $cm^{-3}$) in the termination regions 24.

A first curve 142 on the graph 140 plots breakdown voltage of an embodiment of the SiC—CB device 4A of FIG. 1 as a function of epi doping concentration in the termination regions 24. More specifically, the first curve 142 illustrates an example of the relationship between the breakdown voltage of a SiC—CB device 4A having a single device JTE 12 and the epi doping concentration of the termination regions 24. As further illustrated, the example SiC—CB device 4A has an entitlement breakdown voltage of 2650 volts (V). To the left of the first line 144 (e.g., for an epi doping concentration less than or equal to $2.0 \times 10^{15}$ $cm^{-3}$, which is referred to herein as the minimized epi doping concentration for this SiC device 4A), the avalanche breakdown of the SiC—CB device 4A occurs in the active area 6 and/or the intermediate area 8 (e.g., at the CB layer 18). To the right of the first line 144 (e.g., for a doping concentration greater than $2.0 \times 10^{15}$ $cm^{-3}$), the avalanche breakdown occurs at the termination area 10 (e.g., the device JTE 12) and/or at the intersection of at the intersection of the device JTE 12 and the intermediate well region 66. As a result, for epi doping concentrations greater than $2.0 \times 10^{15}$ cm$^{-3}$ (e.g., the minimized epi doping concentration for this embodiment), the maximum breakdown voltage of the SiC—CB device 4A decreases as the epi doping concentration of the termination regions 24 increases. Accordingly, for SiC—CB devices 4A having a termination area 10 with a single JTE 12, the termination regions 24 may implemented with an epi doping concentration less than or equal to 2.0×10$^{15}$ cm$^{-3}$ (e.g., 8.0×10$^{13}$ cm$^{-3}$, 1.0×10$^{15}$ cm$^{-3}$).

A second curve 146 on the graph 140 plots breakdown voltage of an embodiment of the SiC—CB device 4B of FIG. 5 as a function of epi doping concentration in the termination regions 24. More specifically, the second curve 146 illustrates an example of the relationship between the breakdown voltage of the SiC—CB device 4B having the first JTE 12A disposed in the first epi layer 14A (e.g., CB layer 18), as well as a device layer JTE 12Z disposed in the device epi layer 14Z, and the doping concentration of the termination regions 24, wherein the SiC—CB device 4B has an entitlement breakdown voltage of 2650 volts (V). To the left of the second line 148 (e.g., for a doping concentration less than or equal to 5.0×10$^{15}$ cm$^{-3}$, which is referred to herein as the minimized epi doping concentration for this SiC device 4B), the avalanche breakdown occurs in the active area 6 and/or the intermediate area 8 (e.g., in the CB layer 18). To the right of the second line 148 (e.g., for a doping concentration greater than 5.0×10$^{15}$ cm$^{-3}$), the avalanche breakdown occurs in the termination area 10 (e.g., the device layer JTE 12Z) and/or in the intersection of at the intersection of the device layer JTE 12Z and the intermediate well region 66. As a result, for epi doping concentrations greater than 5.0×10$^{15}$ cm$^{-3}$ (e.g., the minimized epi doping concentration for this embodiment), the maximum breakdown voltage of the SiC—CB device 4B decreases as the epi doping concentration of the termination regions 24 increases. Accordingly, for SiC—CB devices 4B having a first JTE 12A and a device layer JTE 12Z, the termination regions 24 may implemented with a doping concentration less than or equal to 5.0×10$^{15}$ cm$^{-3}$ (e.g., 2.5×10$^{15}$ cm$^{-3}$, 3.0×10$^{15}$ cm$^{-3}$, 4.0×10$^{15}$ cm$^{-3}$).

As the difference between the doping concentration denoted by the first line 144 and the second line 148 illustrates, including additional JTEs 12 in the termination area 10 of the SiC—CB device 4 increases the range of the epi doping concentration of the termination regions 24 suitable to facilitate the maximum breakdown of the SiC—CB device 4. That is, for example, the range of the minimized epi doping concentration termination regions 24 may have greater tolerance to increases in epi doping concentrations for device designs with a greater number of JTEs 12.

Figure 8:
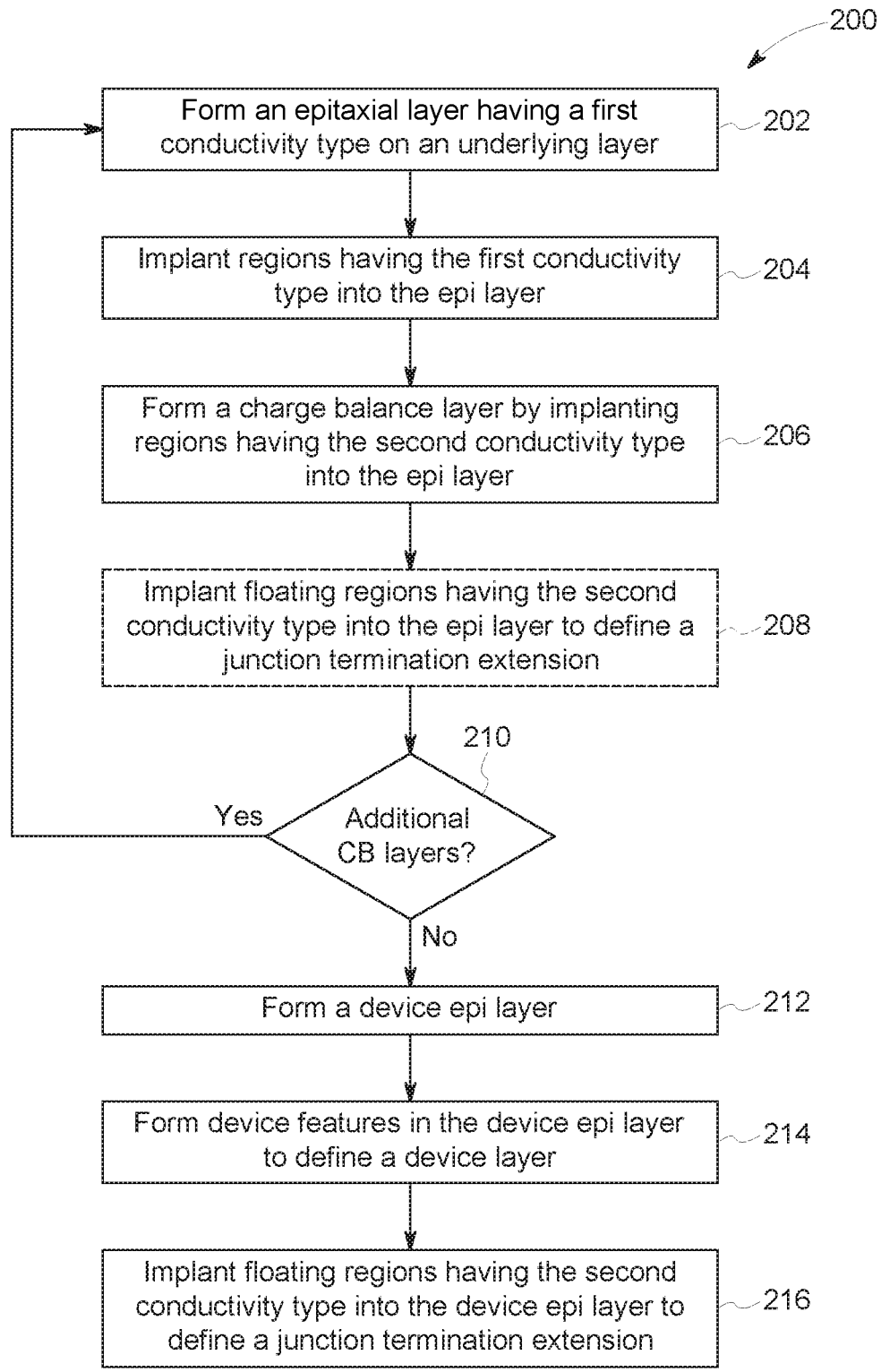
FIG. 8 is flow chart of a process for manufacturing an embodiment of the SiC—CB device having one or more junction terminations, in accordance with an embodiment.

FIG. 8 is a flow chart of a process 200 for manufacturing an embodiment of the SiC—CB device 4 having one or more junction terminations, such as one or more JTEs 12 (e.g., 4A, 4B), in accordance with embodiments described herein. Although the following description of the process 200 is described in a particular order, which represents a particular embodiment, it should be noted that the process 200 may be performed in any suitable order. Further, certain steps may be repeated or skipped altogether, and additional steps may be included in the process 200. The following description of the process 200 is described with reference to embodiments of the SiC—CB device 4 illustrated in FIGS. 1, 2, and 5.

The illustrated process begins with forming (process block 202) an epi layer having a minimized epi doping concentration of first conductivity type on an underlying layer. In some embodiments, the underlying layer may include the semiconductor substrate layer 20. As described above, the substrate layer 20 may be made of silicon, silicon carbide (SiC), gallium nitride, diamond, aluminum nitride, and/or boron nitride. Alternatively, the epi layer may be formed on another epi layer 14 and/or a CB layer 18, as described in greater detail below.

To form the first epi layer 14A on the underlying layer, the epi layer 14A may be grown using chemical vapor deposition (CVD). However, in some embodiments, the epi layer 14A may be grown onto the underlying layer using any suitable technique. The epi layer 14A may be formed from one or more wide-bandgap semiconductor materials, such as silicon carbide, gallium nitride, diamond, aluminum nitride, and/or boron nitride. Further, as discussed above, the epi layer 14A may have a first conductivity type (e.g., n-type) and a low dopant concentration relative to other regions of the SiC—CB device 4 (e.g., the CB regions 34, the JTE 12, and/or the like). More specifically, for a SiC—CB device 4A having a single JTE 12 (e.g., the device layer JTE 12Z), the first epi layer 14A may be formed with a minimized epi doping concentration that is less than or equal to 2.0×10$^{15}$ cm$^{-3}$, such as between 8.0×10$^{13}$ cm$^{-3}$ and 1.0×10$^{15}$ cm$^{-3}$. In embodiments having two or more JTEs 12 (e.g., 4B), the first epi layer 14A may be formed with a minimized epi doping concentration that is less than or equal to 5.0×10$^{15}$ cm$^{-3}$.

After the first epi layer 14A is formed on the underlying layer, the illustrated process proceeds with forming (process block 204) a CB layer 18 by implanting regions of a first conductivity type into the first epi layer 14A. More specifically, to form the CB layer 18, one or more regions having the first conductivity type may be implanted into a the active region 32A and/or the intermediate region 28A within the first epi layer 14A to adjust the doping concentration of the active region 32A and/or the intermediate region 28A to a doping concentration greater than or equal to 5×10$^{15}$ per cubic centimeter (cm$^{-3}$), such as 1.0×10$^{16}$ cm$^{-3}$. With reference to FIG. 1, the implanted regions may form the remainder 36 of the CB layer 18. Moreover, as illustrated the implanted regions of the first conductivity type (e.g., n-type) may extend through the thickness 37A of the first epi layer 14A. Accordingly, in some embodiments, the regions of the first conductivity type may be implanted using a suitable high energy ion implantation technique. As such, each of the one or more regions may be implanted to a depth greater than 1 μm (e.g., to depths of 5 μm to 15 μm) within the epi layer 14A. Moreover, an implantation energy greater than 500 keV and/or less than 50 MeV may be used to implant each of the one or more regions. As such, a high energy implantation mask (e.g., silicon on insulator (SOI), polysilicon, thick silicon oxide, high-Z material) may be used in conjunction with the high energy ion implantation. As used herein, a "high-Z material" refers to a material, such as a metal, having an atomic number greater than or equal to 26, including but not limited to iron (Fe), nickel (Ni), molybdenum (Mo), silver (Ag), platinum (Pt), and so forth.

Additionally, to form the CB layer 18, a set of CB regions 34 of the second conductivity type (e.g., p-type) is implanted (process block 206) into the active region 32A and/or the intermediate region 28A. Each of the set of CB regions 34 may have a doping concentration less than or equal to 1×10$^{18}$ cm$^{-3}$ and/or greater than or equal to 2×10$^{16}$ cm$^{-3}$, as described above. More specifically, in some embodiments, because the each of the set of CB regions 34 may be implanted with a variable distribution of dopant concentrations, the CB regions 34 may be described as having an integrated charge (e.g., dose) of approximately 2×10$^{13}$ cm$^{-2}$ (e.g., +/−20% and/or +/−50%). The integrated charge may be determined and/or adjusted based in part on the depth at which the set of CB regions 34 are implanted and/or the implant acceleration energy used to implant the set of CB regions 34. Further, the set of CB regions 34 may be implanted according to any suitable means (e.g., high energy implant, lower energy implant), as discussed below. For example, in some embodiments, prior to implanting the set of CB regions 34, a mask may be formed on at least a portion of the epi layer 14A. The mask may be formed from silicon oxide, silicon nitride, polycrystalline silicon, silicon, a metal layer, a resist layer, or a suitable combination thereof. Moreover, the mask may be formed using any suitable means. That is, for example, the mask may be deposited, grown, and/or coated directly onto the portion of the epi layer 14A. Furthermore, once the mask material has been deposited on the surface of the epi layer 14A, the mask may be formed by patterning (e.g., lithographically patterning) the mask material to expose or uncover a portion of the epi layer 14A. The set of CB regions 34 may then be selectively implanted through the exposed portion of the epi layer 14A, and the mask may then be removed.

In some embodiments, the set of CB regions 34 may be implanted with standard low energy implantation techniques. For example, the set of CB regions 34 may be implanted to a depth less than or equal to 1 µm. Accordingly, an implantation energy less than 500 keV may be used to implant each of the CB regions 34. However, in some embodiments, the set of CB regions 34 may be implanted according to a suitable high energy ion implantation technique. Accordingly, an implantation energy greater than 500 keV and/or less than 50 MeV may be used to implant each of the CB regions 34. Moreover, the mask described above may be a high energy implantation mask (e.g., silicon on insulator (SOI), polysilicon, thick silicon oxide, high-Z materials) used in conjunction with the high energy ion implantation.

In some embodiments, after forming the CB layer 18, the process 200 proceeds with implanting (process block 208) floating regions having the second conductivity type into the termination region 24A of the of the first epi layer 14A to define a junction termination, such as a JTE. More specifically, to manufacture a SiC—CB device 4B with at least a first JTE 12A internal to the SiC—CB device 4B (e.g., disposed in at least the CB layer 18) and a device layer JTE 12Z adjacent to the surface 42 of the SiC—CB device 4B, as illustrated in FIG. 5, the floating regions 68 may be implanted into the termination region 24A of the first epi layer 14A. As further described above, in SiC—CB devices having additional epi layers 14 (e.g., 14B, 14C, and so forth) the floating regions 68 may be selectively implanted into each epi layer 14, every other epi layer 14, and/or the like.

The floating regions 68 may be implanted according to any suitable means (e.g., high energy implant, lower energy implant), as described above with reference to the set of CB regions 34. Accordingly, in some embodiments, the floating regions 68 may then be selectively implanted through a portion of the termination region 24A exposed by a mask formed on the termination region 24A, and the mask may then be removed. Further, the floating regions 68 may be implanted to a depth less than or equal to 1 µm. Accordingly, an implantation energy less than 500 keV may be used to implant each of the floating regions 68. However, in some embodiments, the floating regions 68 may be implanted according to a suitable high energy ion implantation technique. Accordingly, for such embodiments, each of the floating regions 68 may be implanted to a depth greater than approximately 5 µm and/or less than approximately 15 µm within the epi layer 14A. Moreover, an implantation energy greater than 500 keV and/or less than 50 MeV may generally be used to implant each of the floating regions 68.

Moreover, in some embodiments, the floating regions 68 may be implanted concurrently with the set of CB regions 34. For instance, the floating regions 68 of the first JTE 12A may be implanted with the same dopant type (e.g., a p-type or n-type dopant), utilizing the same materials (e.g. Al, B, N, P, etc.), and using the same dose/energy (e.g., $9.0 \times 10^{12}$ $cm^{-2}$) during the same ion implantation step used to implant the set of CB regions 34, which may reduce fabrication time and cost. In other embodiments, the floating regions 68 of the first JTE 12 may be implanted using a different dopant material and/or dose/energy, which may increase the fabrication time and cost, but may enable greater flexibility in the design (e.g., dopant material, effective integrated charge, and/or the like) of the first JTE 12A.

In embodiments having only a device layer JTE 12Z, as illustrated in FIG. 1, the process 200 may proceed without the floating regions 68 being implanted into the termination region 24A of the first epi layer 14A. Nevertheless, to form a suitable number of CB layers 14 in the SiC—CB device 4, a portion of the process 200 (e.g., process block 202, process block 204 process block 206, and/or process block 208) may be repeated one or more times. Accordingly, after the floating regions 68 are implanted and/or in embodiments having only a device layer JTE 12Z, the process 200 may proceed with determining (decision block 208) whether an additional CB layer 18B will be added to the SiC—CB device 4. In embodiments having one or more additional CB layers 18, a second epi layer 14B may be formed (process block 202) on the previously implanted CB layer 18A and a second CB layer 18B may be formed (e.g., process block 204, process block 206). Further, as described above, additional floating regions 68 may optionally be implanted (process block 208) to define an additional JTE 12.

After completing fabrication of the one or more CB layers 18, the illustrated process 200 proceeds with forming (process block 212) a device epi layer 14Z having a minimized epi doping concentration of a first conductivity type. As discussed with reference to the formation of the one or more epi layers 14 of the CB layers 18 (process block 202), the device epi layer 14Z may be grown using CVD. Alternatively, the device epi layer 14Z may be grown onto the underlying CB layer 18 using any suitable technique. The device epi layer 14Z may also be formed from one or more wide-bandgap semiconductor materials, such as silicon carbide, gallium nitride, diamond, aluminum nitride, and/or boron nitride.

Further, the device epi layer 14Z may have a minimized epi doping concentration of the first conductivity type (e.g., n-type). More specifically, for a SiC—CB device 4A having a single JTE 12 (e.g., the device layer JTE 12Z), the device epi layer 14Z may be formed with a minimized epi doping concentration that is less than or equal to $2.0 \times 10^{15}$ $cm^{-3}$, such as between $8.0 \times 10^{13}$ $cm^{-3}$ and $1.0 \times 10^{15}$ $cm^{-3}$. In embodiments having two or more JTEs 12 (e.g., 12A, 12Z), the device epi layer 14Z may be formed with a minimized epi doping concentration that is less than or equal to $5.0 \times 10^{15}$ $cm^{-3}$. Further, in some embodiments, one or more regions having the first conductivity type may be implanted into a first portion of the device epi layer 14Z (e.g., the active region 32Z and the intermediate region 28Z) to adjust the doping concentration of the first conductivity type in other portions of the device epi layer 14Z to a doping concentration greater than or equal to $5 \times 10$ per cubic centimeter ($cm^{-3}$), such as $1.0 \times 10^{16}$ $cm^{-3}$.

The process 200 may then proceed with forming (process block 214) certain device features within the active region 32Z and/or the intermediate region 28Z of the device epi layer 14Z to define a device layer 16. That is, for example, the CB bus 38, the well region 40, the source region 44, and/or the like may be formed (e.g., implanted) in the active region 32Z and/or the intermediate region 28Z to define the device layer 16. For instance, in some embodiments, the CB bus 38 may be implanted in the active region 32Z and the intermediate region 28Z using high energy implantation techniques. That is, for example, the CB bus 38 may be implanted with implant acceleration energies between approximately 500 keV and approximately 60 MeV to achieve a desired depth. In some embodiments, for example, the CB bus 38 may be implanted such that it connects to and electrically couples with one or more CB regions 34. Further, while the process block 212 is described herein as a single step, it may be appreciated that forming the device features (e.g., the CB bus 38, the well region 40, the intermediate well region 66, the source region 44, and/or the like) may constitute multiple steps, such as a separate implantation step for each respective feature and/or multiple implantation steps for each feature. In some embodiments, for example, two or more portions of the CB bus 38 may be implanted during different respective steps involved in fabricating the SiC—CB device 4. For instance, in a SiC—CB device 4B with multiple CB layers 18 (e.g., a first CB layer 18A and a second CB layer 18B), a first portion of the CB bus 38 may be implanted after the second CB layer 18B is formed to connect to and electrically couple with one or more CB regions 34 in the first CB layer 18A. Subsequently, a second portion of the CB bus may be implanted into the device layer 16 to connect to and electrically couple with the first portion of the CB bus 38 and one or more CB regions 34 in the second CB layer 18B, as well as the well region 40 and/or the intermediate well region 66. Accordingly, embodiments described herein are intended to be illustrative and not limiting.

Further, the process 200 may involve implanting (process block 216) floating regions having the second conductivity type into the termination region 24Z of the device epi layer 14Z to define a junction termination, such as the device layer JTE 12Z. As described above with reference to process block 206, the floating regions 68 may be implanted according to any suitable means (e.g., high energy implant, lower energy implant) to a certain depth within the termination region 24Z (e.g., greater than approximately 5 μm and/or less than approximately 15 μm or less than or equal to 1 μm, respectively). Further, in some embodiments, the floating regions 68 implanted into the termination region 24Z may have the same effective doping profile as the floating regions 68 implanted into termination regions 24 (e.g., 24A, 24B, and/or the like) formed at previous steps (e.g., process block 206) of the process 200. In other embodiments, however, the floating regions 68 implanted into the termination region 24Z may have a different effective doping profile compared to the floating regions 68 implanted into other termination regions 24 (e.g., 24A, 24B, and/or the like). For example, the JTE 12Z defined by the floating regions 68 implanted into the device termination region 24Z may have an integrated charge of $1.6 \times 10^{13}$ cm$^{-2}$, while the JTE 12A defined by the floating regions 68 implanted into the termination region 24A may have an integrated charge of $9.0 \times 10^{12}$ cm$^{-2}$, as discussed above. Subsequently, other processing steps may be performed to form other features (e.g., gate electrode 48, dielectric layer 46, source contact 54, drain contact 50, and/or the like) of the SiC—CB device 4 to form a functional device, in accordance with the present disclosure.

Technical effects of the present approach include effective termination of SiC—CB devices. Additionally, the disclosed termination designs consume a relatively smaller portion of the die area relative to typical termination designs and are relatively low-cost to fabricate. For example, the disclosed junction termination extensions (JTEs) may be designed with a width such that the ratio of the JTE width to the one dimensional (1-D) depletion width is minimized (e.g., less than 5, such as between 1.5 and 5, between 1.5 and 4, between 1.5 and 3, between 1.5 and 2), which results in a device having increased die area available for the active area. Additionally, the disclosed termination designs cause avalanche breakdown to desirably occur predominately within the active area and/or intermediate area of the device, enabling a breakdown voltage that is close to device entitlement.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A silicon carbide (SiC) charge balance (CB) device, comprising:
   a first charge balance (CB) layer comprising a first epitaxial (epi) layer, wherein an active area of the first epi layer comprises a first doping concentration of a first conductivity type and a first plurality of CB regions of a second conductivity type, and wherein a termination area of the first epi layer comprises a minimized epi doping concentration of the first conductivity type;
   a device layer comprising a second epi layer disposed on the first CB layer, wherein an active area of the second epi layer comprises the first doping concentration of the first conductivity type, and wherein a termination area of the device layer comprises the minimized epi doping concentration of the first conductivity type and a first plurality of floating regions of the second conductivity type that form a first junction termination of the device, wherein the first junction termination comprises a junction termination extension (JTE) that has a width between 1.5 times and 5 times a combined thickness of the first epi layer and the second epi layer; and
   a CB bus region of the second conductivity type, wherein the CB bus region extends between and electrically couples a CB region of the first plurality of CB regions of the first CB layer to a region of the device layer having the second conductivity type.

2. The SiC—CB device of claim 1, wherein the minimized epi doping concentration is less than or equal to $2\times10^{15}$ cm$^{-3}$.

3. The SiC—CB device of claim 1, wherein the first junction termination comprises a floating field ring (FFR), a single zone junction termination extension (JTE), a multiple zone JTE, a graded zone JTE, a multiple floating zone JTE, a space modulated JTE, or a combination thereof.

4. The SiC—CB device of claim 1, wherein a thickness of the first epi layer is between 2 microns (μm) and 12 μm.

5. The SiC—CB device of claim 1, wherein the termination area of the first epi layer comprises a second plurality of floating regions of the second conductivity type that form a second junction termination of the device.

6. The SiC—CB device of claim 5, wherein the second junction termination comprises a first integrated charge, wherein the first junction termination has a second integrated charge greater than the first integrated charge.

7. The SiC—CB device of claim 1, wherein the first epitaxial (epi) layer is disposed on an underlying layer formed from wide-bandgap material.

8. The SiC—CB device of claim 1, comprising a second CB layer comprising a third epi layer disposed under the first CB layer, wherein an active area of the third epi layer comprises the first doping concentration of the first conductivity type and a second plurality of CB regions of the second conductivity type, and wherein a termination area of the third epi layer comprises the minimized epi doping concentration of the first conductivity type.

9. The SiC—CB device of claim 8, wherein the termination area of the third epi layer comprises a second plurality of floating regions of the second conductivity type that form a second junction termination of the device.

10. The SiC—CB device of claim 9, wherein the second junction termination comprises a floating field ring (FFR), a single zone junction termination extension (JTE), a multiple zone JTE, a graded zone JTE, a multiple floating zone JTE, a space modulated JTE, or a combination thereof.

11. The SiC—CB device of claim 1, wherein nitrogen is inadvertently doped in the first epi layer, or the second epi layer, or both, at the minimized epi doping concentration.

12. A silicon carbide (SiC) charge balance (CB) device, comprising:
a first charge balance (CB) layer comprising a first epitaxial (epi) layer, wherein a termination area of the first epi layer comprises a minimized epi doping concentration of a first conductivity type;
a device layer comprising a second epi layer disposed on the first CB layer, wherein a termination area of the device layer comprises the minimized epi doping concentration of the first conductivity type and a plurality of floating regions of a second conductivity type that form a junction termination of the device, wherein the junction termination comprises a junction termination extension (JTE) that has a width between 1.5 times and 5 times a combined thickness of the first epi layer and the second epi layer; and
a CB bus region of the second conductivity type, wherein the CB bus region extends between and electrically couples a CB region of the first plurality of CB regions of the first CB layer to a region of the device layer having the second conductivity type.

13. The SiC—CB device of claim 12, wherein an active area of the first epi layer and an active area of the second epi layer comprise a first doping concentration of a first conductivity type that is substantially greater than the minimized epi doping concentration.

14. The SiC—CB device of claim 12, wherein an active area of the first epi layer comprises a plurality of CB regions having a doping concentration less than or equal to $1\times10^{18}$ cm$^{-3}$ and greater than or equal to $2\times10^{16}$ cm$^{-3}$ of the second conductivty type.

15. The SiC—CB device of claim 12, wherein each the plurality of floating regions has a respective width, and wherein the respective width of each of the plurality of floating regions is between 0.8 microns (μm) and 5 μm.

16. The SiC—CB device of claim 12, wherein an integrated charge of the JTE is greater than or equal to $6\times10^{12}$ cm$^{-2}$ and less than or equal to $3\times10^{13}$ cm$^{-2}$.

* * * * *